(12) United States Patent
Yu et al.

(10) Patent No.: US 10,535,839 B2
(45) Date of Patent: Jan. 14, 2020

(54) PACKAGE STRUCTURE AND ORGANIC LIGHT EMITTING DISPLAY APPARATUS COMPRISING SELF-REPAIRING FUNCTION LAYER

(71) Applicant: BOE TECHNOLOGY GROUP CO., LTD., Beijing (CN)

(72) Inventors: Jing Yu, Beijing (CN); YuJu Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/975,985

(22) Filed: May 10, 2018

(65) Prior Publication Data

US 2019/0067635 A1 Feb. 28, 2019

(30) Foreign Application Priority Data

Aug. 29, 2017 (CN) .......................... 2017 1 0757303

(51) Int. Cl.
*H01L 51/52* (2006.01)

(52) U.S. Cl.
CPC ........ *H01L 51/5253* (2013.01); *H01L 51/529* (2013.01); *H01L 2251/568* (2013.01)

(58) Field of Classification Search
CPC ................................................ H01L 2251/568
See application file for complete search history.

(56) References Cited

U.S. PATENT DOCUMENTS

| 2015/0014646 | A1* | 1/2015 | Kaplan | H01L 51/5253 257/40 |
| 2017/0092897 | A1* | 3/2017 | Liu | H01L 51/004 |
| 2018/0342693 | A1* | 11/2018 | Sato | H01L 51/529 |
| 2019/0058161 | A1* | 2/2019 | Song | H01L 51/5256 |

FOREIGN PATENT DOCUMENTS

CN 106409873 A 2/2017

* cited by examiner

*Primary Examiner* — Daniel Whalen
(74) *Attorney, Agent, or Firm* — Calfee, Halter & Griswold LLP

(57) ABSTRACT

The present disclosure relates to the field of display technology, and discloses a package structure and an organic light emitting display apparatus. The package structure includes a self-repairing functional layer and a heating layer for heating the self-repairing functional layer. A forming material of the self-repairing functional layer at least includes: a self-repairing material.

15 Claims, 5 Drawing Sheets

PACKAGE STRUCTURE AND ORGANIC LIGHT EMITTING DISPLAY APPARATUS COMPRISING SELF-REPAIRING FUNCTION LAYER

CROSS REFERENCE

The present application claims the priority of Chinese Patent Application No. 201710757303.1, and filed on Aug. 29, 2017, and the entire contents thereof are incorporated herein by reference.

TECHNICAL FIELD

The present disclosure relates to the field of display technology and discloses a package structure and an organic light emitting display apparatus.

BACKGROUND

Compared with conventional liquid crystal displays, organic light emitting devices (OLEDs) have advantages of active light emission, fast response, large viewing angle, and flexibility. In recent years, with the maturation and development of organic electroluminescent technology, related display products have been put into the market. However, organic materials and metals are quite sensitive to moisture and oxygen, and the device needs to be packaged for protection after been fabricated, to prevent degradation of device lifetime due to moisture and oxygen erosion. Therefore, the package process has a very important role in maintaining the overall light-emitting performance of the device.

In a traditional OLED package process, one or more layers of inorganic and/or organic thin films having good water-oxygen blocking capability are prepared on the device by vapor deposition, sputtering, or thermal deposition, to play a role of blocking the moisture and oxygen.

It should be noted that, information disclosed in the above background portion is provided only for better understanding of the background of the present disclosure, and thus it may contain information that does not form the prior art known by those ordinary skilled in the art.

SUMMARY

The present disclosure provides a package structure, for packaging a display apparatus, the package structure including: an inorganic layer; a self-repairing functional layer attached to the inorganic layer: and a heating layer formed on the self-repairing function layer or heating the self-repairing functional layer, wherein the self-repairing functional layer at least including a self-repairing material to repair a crack in the inorganic layer.

In an optional embodiment, the self-repairing functional layer includes: an organic layer, and the self-repairing material is doped within the organic layer.

In an optional embodiment, a doping mass ratio of the self-repairing material in the organic layer is less than or equal to 30%.

In an optional embodiment, a temperature of a self-repairing reaction of the self-repairing material is lower than a glass transition temperature of a forming material of the organic layer.

In an optional embodiment, the inorganic layer includes a first inorganic layer and a second inorganic layer, wherein the self-repairing functional layer is located between the first inorganic layer and the second inorganic layer.

In an optional embodiment, the package structure further includes: an organic layer, and the self-repairing functional layer is located on at least one side of the organic layer.

In an optional embodiment, the inorganic layer includes a first inorganic layer and a second inorganic layer, and the organic layer is located between the first inorganic layer and the second inorganic layer, wherein
the self-repairing functional layer is at least located between the first inorganic layer and the organic layer, or
the self-repairing functional layer is at least located between the second inorganic layer and the organic layer.

In an optional embodiment, the heating layer is located on a side of the self-repairing functional layer towards the first inorganic layer, or
the heating layer is located on a side of the self-repairing functional layer towards the second inorganic layer.

In an optional embodiment, the heating layer is located on a side of the first inorganic layer away from the second inorganic layer; or
the heating layer is located between the first inorganic layer and the self-repairing functional layer; or
the heating layer is located between the second inorganic layer and the self-repairing functional layer; or
the heating layer is located on a side of the second inorganic layer away from the first inorganic layer.

In an optional embodiment, the self-repairing material includes: at least one of ethylene-vinyl acetate copolymer, polyethylene oxide, polyolefin elastomer (POE), polydimethylsiloxane, and polyethylene glycol.

In an optional embodiment, a thickness of the self-repairing functional layer is greater than or equal to 2 microns and less than or equal to 8 microns.

In an optional embodiment, the heating layer is a graphene layer or a metal mesh layer or a metal thin film layer.

The present disclosure further provides an organic light emitting display apparatus, including an organic light emitting device, and any one of the package structures located on the organic light emitting device.

In an optional embodiment, a resistance of the heating layer is greater than that of the organic light emitting device.

In an optional embodiment, the heating layer is connected to an external circuit through an array layer within the organic light emitting device.

It is to be understood that both the foregoing general description and the following detailed description are exemplary and explanatory only and are not restrictive of the present disclosure, as claimed.

DETAILED DESCRIPTION

The following will clearly and completely describe the technical solutions in the embodiments of the present disclosure with reference to the accompanying drawings in the embodiments of the present disclosure. Apparently, the described embodiments are merely a part of the embodiments of the present disclosure and not all of the embodiments. All other embodiments obtained by a person of ordinary skill in the art based on the embodiments of the present disclosure without creative efforts shall fall within the protection scope of the present disclosure.

Figure 1:
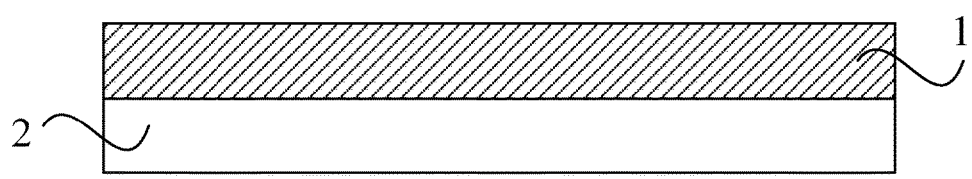
FIG. 1 is a first schematic structural diagram of a package structure according to an embodiment of the present disclosure.

As shown in FIG. 1, the present disclosure provides a package structure, for packaging a display apparatus. The package structure includes a self-repairing functional layer 2, and a heating layer 1 for heating the self-repairing functional layer 2. A forming material of the self-repairing functional layer 2 at least includes: a self-repairing material 22.

In the package structure provided by the present disclosure, a cracked package layer can be repaired through the provided self-repairing functional layer 2 and the heating layer 1, and when the heating layer 1 heats the self-repairing material 22, the self-repairing material 22 within the self-repairing functional layer 2 will become glutinous and will penetrate into cracks in the damaged package layer to repair the damaged package layer, and this type of repairing can be repeated.

Therefore, the package structure provided by the present disclosure can repair the crack generated in the package layer, improve the packaging effect, and improve the quality of the organic light emitting display apparatus.

The self-repairing function of the self-repairing material 22 may be implemented by means of ultraviolet irradiation or the like.

There may be various kinds of specific structures of the above functional layer, and there may also be various kinds of specific structures of the self-repairing functional layer 2.

Figure 2:
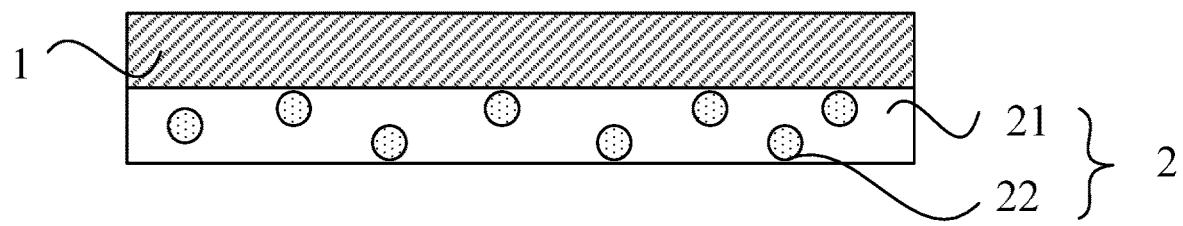
FIG. 2 is a second schematic structural diagram of a package structure according to an embodiment of the present disclosure.

In an optional embodiment, as shown in FIG. 2, the self-repairing functional layer 2 includes: an organic layer 21, and the self-repairing material 22 is doped within the organic layer 21. The self-repairing material 22 may be doped as a second dopant to be doped in the organic material. It should be noted that the circle in FIG. 2 is only for illustrating the self-repairing material 22, and the shape of the self-repairing material 22 is not limited.

Optionally, a doping mass ratio of the self-repairing material 22 in the organic layer 21 is less than or equal to 30%.

In order to prevent the property of the organic material layer from being changed due to heating and affect its own packaging performance, preferably, a temperature of a self-repairing reaction of the self-repairing material 22 is lower than a glass transition temperature of a forming material of the organic layer 21.

Optionally, a temperature of a self-repairing reaction of the self-repairing material 22 is less than or equal to 60 degrees Celsius.

In another optional embodiment, as shown in FIG. 3, FIG. 4, FIG. 5 and FIG. 6, the package structure includes a first inorganic layer 3 and a second inorganic layer 4, in addition to the self-repairing functional layer 2. The self-repairing functional layer 2 is located between the first inorganic layer 3 and the second inorganic layer 4. The inorganic layer has better water and oxygen blocking properties.

Figure 7:
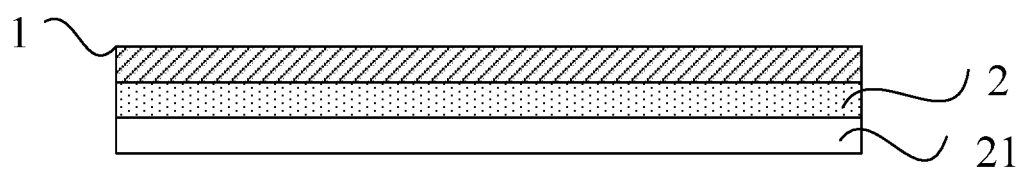
FIG. 7 is a seventh schematic structural diagram of a package structure according to an embodiment of the present disclosure.

In still another optional embodiment, as shown in FIG. 7, the package structure includes an organic layer 21, and the self-repairing functional layer 2 is located on at least one side of the organic layer 21. When the package layer selects an organic material having better water and oxygen blocking properties, the self-repairing material 22 may be disposed on a surface of the organic layer 21 by surface modification. That is, the self-repairing material 22 forms the self-repairing functional layer by its own, such that the package structure only includes the organic layer 21.

In another optional embodiment, as shown in FIG. 8, FIG. 9, FIG. 10, FIG. 11 and FIG. 12, the package structure further includes a first inorganic layer 3 and a second inorganic layer 4, in addition to the organic layer 21 and the self-repairing functional layer 2. The organic layer 21 is located between the first inorganic layer 3 and the second inorganic layer 4.

Figure 9:
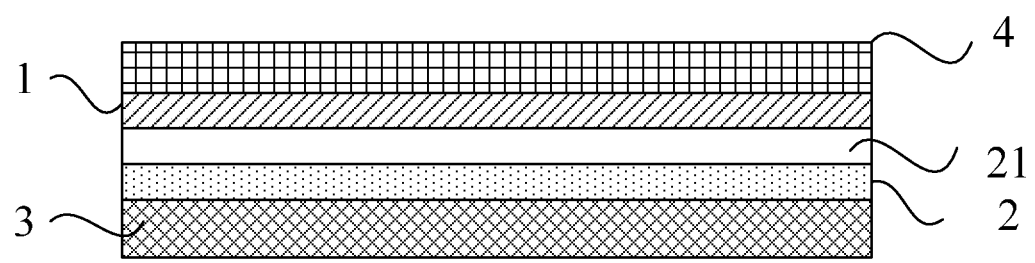
FIG. 9 is a ninth schematic structural diagram of a package structure according to an embodiment of the present disclosure.

As shown in FIG. 9, the self-repairing functional layer 2 is at least located between the first inorganic layer 3 and the organic layer 21.

Figure 8:
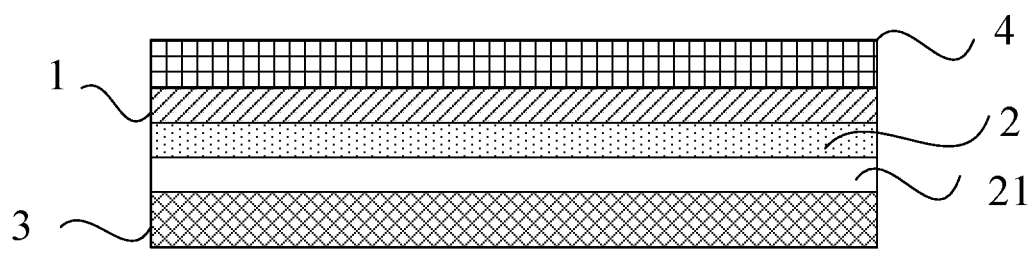
FIG. 8 is an eighth schematic structural diagram of a package structure according to an embodiment of the present disclosure.

Alternatively, as shown in FIG. 8, the self-repairing functional layer 2 is at least located between the second inorganic layer 4 and the organic layer 21.

Figure 4:
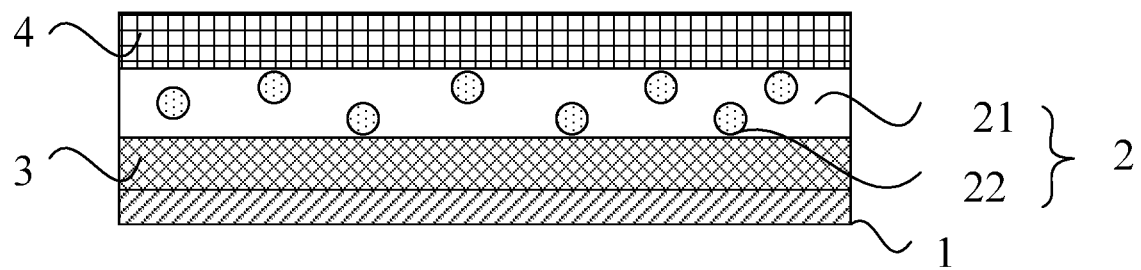
FIG. 4 is a fourth schematic structural diagram of a package structure according to an embodiment of the present disclosure.
Figure 12:
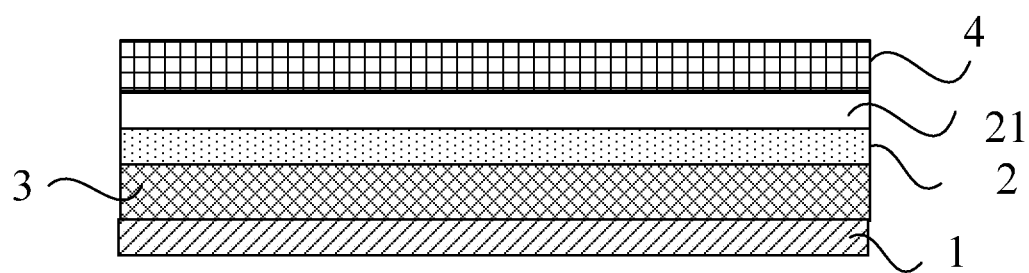
FIG. 12 is a twelfth schematic structural diagram of a package structure according to an embodiment of the present disclosure.

There may be a plurality of specific installation positions of the heating layer 1. Optionally, as shown in FIG. 4 and FIG. 12, the heating layer 1 is located on a side of the first inorganic layer 3 away from the second inorganic layer 4.

Figure 6:
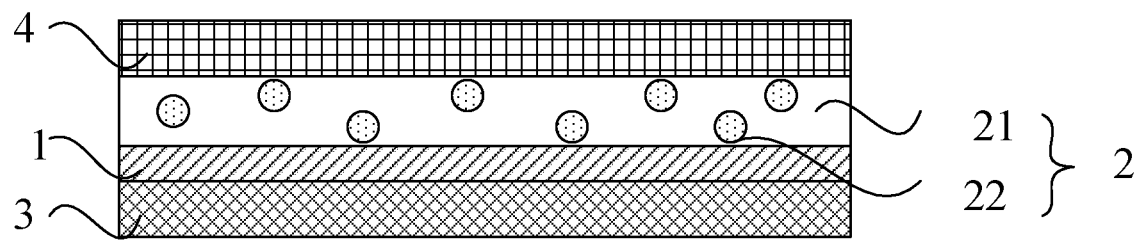
FIG. 6 is a sixth schematic structural diagram of a package structure according to an embodiment of the present disclosure.
Figure 10:
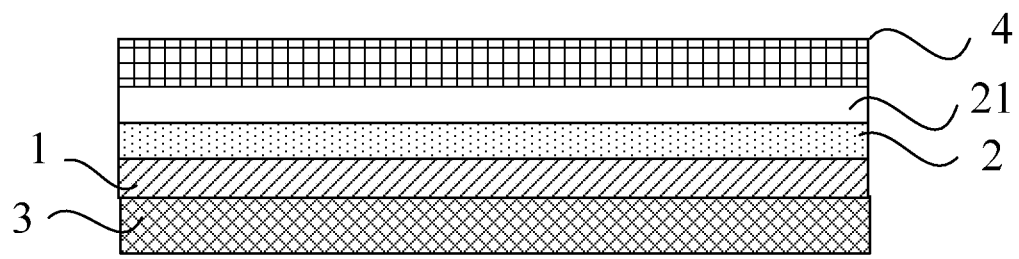
FIG. 10 is a tenth schematic structural diagram of a package structure according to an embodiment of the present disclosure.

Alternatively, as shown in FIG. 6 and FIG. 10, the heating layer 1 is located between the first inorganic layer 3 and the self-repairing functional layer 2.

Figure 5:
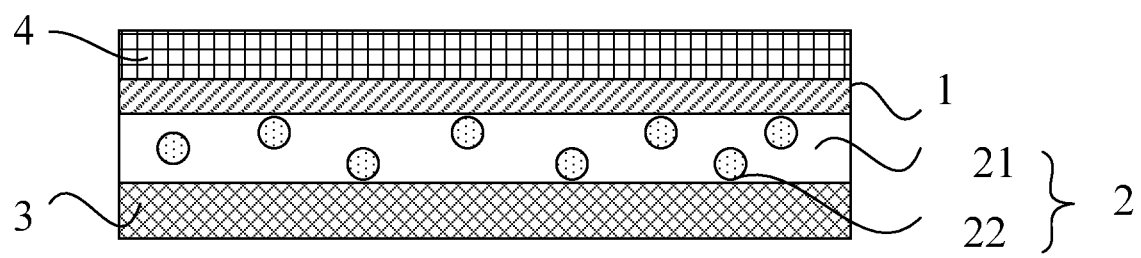
FIG. 5 is a fifth schematic structural diagram of a package structure according to an embodiment of the present disclosure.

Alternatively, as shown in FIG. 5, FIG. 8 and FIG. 9, the heating layer 1 is located between the second inorganic layer 4 and the self-repairing functional layer 2.

Figure 3:
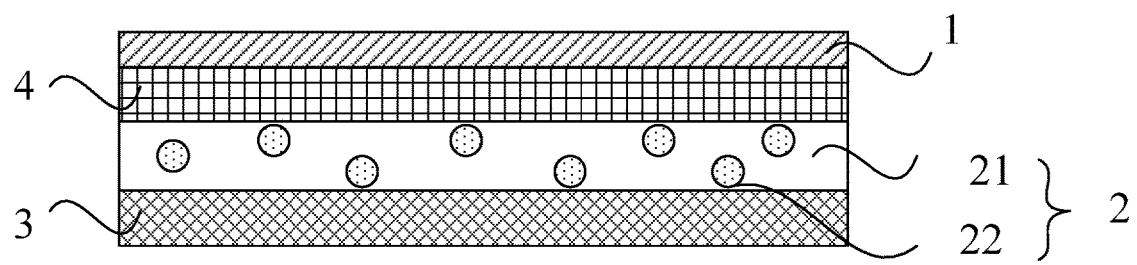
FIG. 3 is a third schematic structural diagram of a package structure according to an embodiment of the present disclosure.
Figure 11:
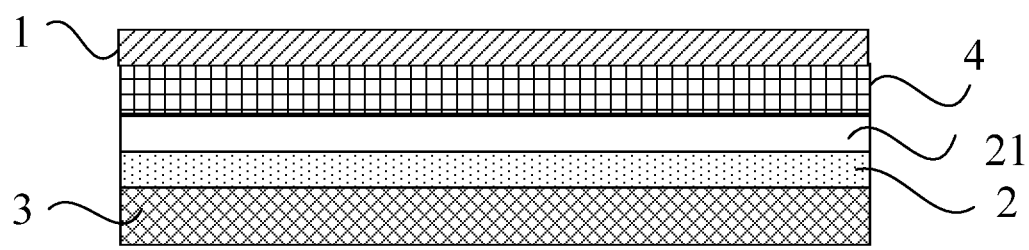
FIG. 11 is an eleventh schematic structural diagram of a package structure according to an embodiment of the present disclosure.

Alternatively, as shown in FIG. 3 and FIG. 11, the heating layer 1 is located on a side of the second inorganic layer 4 away from the first inorganic layer 3. The self-repairing material 22 in the self-repairing functional layer 2, after being heated, may penetrate into the cracks of the damaged inorganic layer through the organic layer 21, and repairs the damaged inorganic layer.

In a preferred embodiment, the heating layer 1 is located on a side of the self-repairing functional layer 2 towards the first inorganic layer 3.

Alternatively, the heating layer 1 is located on a side of the self-repairing functional layer 2 towards the second inorganic layer 4. That is, the heating layer is provided in close contact with the self-repairing functional layer 2 and directly heats the self-repairing functional layer 2.

The above self-repairing material 22 may include: at least one of ethylene-vinyl acetate copolymer, polyethylene oxide, polyolefin elastomer (POE), polydimethylsiloxane, and polyethylene glycol.

Optionally, a thickness of the self-repairing functional layer 2 is greater than or equal to 2 microns and less than or equal to 8 microns. For example, it can be 2 microns, 2.5 microns, 3 microns, 4 microns, 5 microns, 6 microns, 7.5 microns, and 8 microns, etc., which will not be repeated herein one by one.

In any of the above embodiments, the heating layer 1 may be is a graphene layer or a metal mesh layer or a metal thin film layer.

Figure 13:
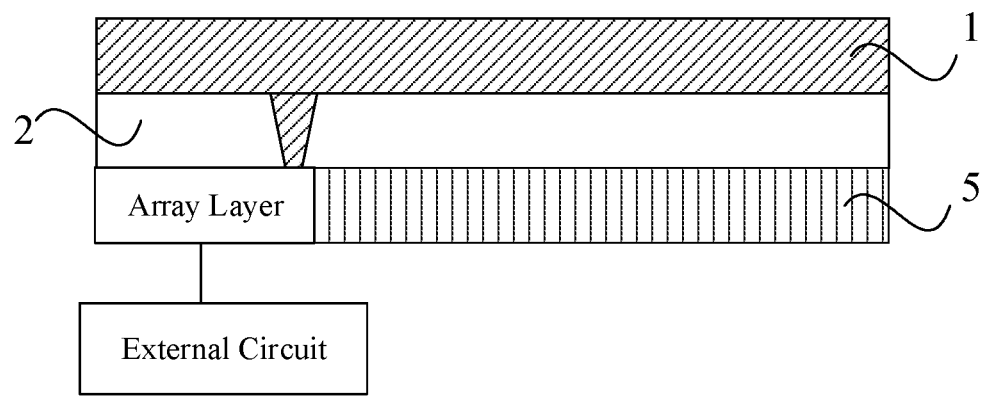
FIG. 13 is a schematic structural diagram of an organic light emitting display apparatus provided by an embodiment of the present disclosure.

As shown in FIG. 13, the present disclosure further provides an organic light emitting display apparatus including an organic light emitting device 5, and any one of the above package structures located on the organic light emitting device 5. Due to the above package structure, cracks generated in the package layer can be repaired, the package effect is improved, and the quality of the organic light emitting display apparatus is improved. Therefore, the organic light emitting display apparatus provided by the present disclosure has better display effect and quality.

In a preferred embodiment, a resistance of the heating layer 1 is greater than that of the organic light emitting device, which facilitates the heat generation of the heating layer 1.

Optionally, the heating layer 1 is connected to an external circuit through an array layer within the organic light emitting device 5. The array layer may be a print circuit board (PCB), a flexible print circuit (FPC) or the like provided in the organic light emitting device 5 for establishing electrical connection between different components (e.g., the components in the organic light emitting device, an external circuit for driving the organic light emitting device or the like. Also, the heating layer 1 may be connected to the array layer via a via hole formed in the self-repairing layer 2, while the present disclosure is not limited thereto. Such a structural arrangement facilitates the preparation. Specifically, the heating layer 1 can be connected to the external circuit through the method of perforating on the array layer. In order to conveniently turn on of the heating layer 1, a switch for controlling the temperature of the heating layer 1 can be provided outside the organic light emitting display apparatus.

It will be apparent to those skilled in the art that various modifications and variations can be made in the present disclosure without departing from the spirit and scope of the disclosure. Thus, if these modifications and variations of the present disclosure fall within the scope of the claims of the present disclosure and their equivalent technologies, the present disclosure also intends to include these modifications and variations.

What is claimed is:

1. A package structure, for packaging a display apparatus, the package structure comprising:
   an inorganic layer;
   a self-repairing functional layer attached to the inorganic layer; and
   a heating layer formed on the self-repairing function layer for heating the self-repairing functional layer,
   wherein the self-repairing functional layer comprises at least a self-repairing material to repair a crack in the inorganic layer,
   wherein the self-repairing functional layer comprises: an organic layer, and the self-repairing material is doped within the organic layer, and
   wherein a temperature of a self-repairing reaction of the self-repairing material is lower than a glass transition temperature of a forming material of the organic layer.

2. The package structure of claim 1, wherein a doping mass ratio of the self-repairing material in the organic layer is less than or equal to 30%.

3. The package structure of claim 1, wherein the inorganic layer comprises a first inorganic layer and a second inorganic layer, wherein the self-repairing functional layer is located between the first inorganic layer and the second inorganic layer.

4. The package structure of claim 3, wherein the heating layer is located on a side of the first inorganic layer away from the second inorganic layer.

5. The package structure of claim 3, wherein the heating layer is located on a side of the second inorganic layer away from the first inorganic layer.

6. The package structure of claim 3, wherein the heating layer is located on a side of the self-repairing functional layer towards the first inorganic layer.

7. The package structure of claim 3, wherein the heating layer is located on a side of the self-repairing functional layer towards the second inorganic layer.

8. The package structure of claim 1, wherein the self-repairing material comprises: at least one of ethylene-vinyl acetate copolymer, polyethylene oxide, polyolefin elastomer (POE), polydimethylsiloxane, and polyethylene glycol.

9. The package structure of claim 1, wherein a thickness of the self-repairing functional layer is greater than or equal to 2 microns and less than or equal to 8 microns.

10. The package structure of claim 1, wherein the heating layer is a graphene layer or a metal mesh layer or a metal thin film layer.

11. An organic light emitting display apparatus, comprising an organic light emitting device, and the package structure located on the organic light emitting device as claimed in claim 1.

12. The organic light emitting display apparatus of claim 11, wherein a resistance of the heating layer is greater than that of the organic light emitting device.

13. The organic light emitting display apparatus of claim 11, wherein the heating layer is connected to an external circuit through an array layer within the organic light emitting device.

14. A package structure, for packaging a display apparatus, the package structure comprising:
   an inorganic layer;
   a self-repairing functional layer attached to the inorganic layer; and
   a heating layer formed on the self-repairing function layer for heating the self-repairing functional layer,
   wherein the self-repairing functional layer comprises at least a self-repairing material to repair a crack in the inorganic layer,
   wherein the self-repairing functional layer comprises: an organic layer, and the self-repairing material is doped within the organic layer,
   wherein the inorganic layer comprises a first inorganic layer and a second inorganic layer, wherein the self-repairing functional layer is located between the first inorganic layer and the second inorganic layer, and wherein the heating layer is located between the first inorganic layer and the self-repairing functional layer.

15. A package structure, for packaging a display apparatus, the package structure comprising:
an inorganic layer;
a self-repairing functional layer attached to the inorganic layer; and
a heating layer formed on the self-repairing function layer for heating the self-repairing functional layer,
wherein the self-repairing functional layer comprises at least a self-repairing material to repair a crack in the inorganic layer,
wherein the self-repairing functional layer comprises: an organic layer, and the self-repairing material is doped within the organic layer,
wherein the inorganic layer comprises a first inorganic layer and a second inorganic layer, wherein the self-repairing functional layer is located between the first inorganic layer and the second inorganic layer, and
wherein the heating layer is located between the second inorganic layer and the self-repairing functional layer.

* * * * *